United States Patent [19]

Ikegami

[11] Patent Number: 5,956,592
[45] Date of Patent: Sep. 21, 1999

[54] METHOD OF MANUFACTURING A SEMICONDUCTOR DEVICE HAVING POLYSILICON RESISTORS WITH A SPECIFIC RESISTANCE RATIO RESISTANT TO MANUFACTURING PROCESSES

[75] Inventor: Masaaki Ikegami, Hyogo-ken, Japan

[73] Assignee: Mitsubishi Denki Kabushiki Kaisha, Tokyo, Japan

[21] Appl. No.: 08/589,222

[22] Filed: Jan. 22, 1996

Related U.S. Application Data

[62] Division of application No. 08/316,380, Sep. 30, 1994, Pat. No. 5,500,553, which is a continuation of application No. 08/096,917, Jul. 26, 1993, abandoned.

[30] Foreign Application Priority Data

Aug. 12, 1992 [JP] Japan ................................. 4-215210
Apr. 8, 1993 [JP] Japan ................................. 5-81967

[51] Int. Cl.⁶ .................................................. H01L 21/20
[52] U.S. Cl. .......................... 438/384; 438/791; 438/958
[58] Field of Search ................................... 437/937, 980, 437/918, 60; 148/DIG. 136

[56] References Cited

U.S. PATENT DOCUMENTS

| | | | |
|---|---|---|---|
| 4,178,674 | 12/1979 | Liu et al. | 437/918 |
| 4,208,781 | 6/1980 | Rao et al. | 437/918 |
| 4,426,658 | 1/1984 | Gontowski, Jr. | 257/538 |
| 4,484,212 | 11/1984 | Komatsu et al. | 257/536 |
| 4,516,313 | 5/1985 | Turi et al. | 257/324 |
| 4,631,705 | 12/1986 | Honda | 257/904 |
| 4,990,461 | 2/1991 | Onozawa | 437/918 |
| 5,043,295 | 8/1991 | Ruggerio et al. | 437/918 |
| 5,084,420 | 1/1992 | Tsai | 437/918 |

FOREIGN PATENT DOCUMENTS

| | | | |
|---|---|---|---|
| 55-53452 | 4/1980 | Japan | 257/538 |
| 60-244057 | 12/1985 | Japan . | |
| 61-85851 | 5/1986 | Japan | 257/538 |
| 61-144050 | 7/1986 | Japan | 257/536 |
| 61-166135 | 7/1986 | Japan . | |
| 61-174746 | 10/1986 | Japan . | |
| 63-38324 | 3/1988 | Japan . | |
| 63-248157 | 10/1988 | Japan . | |
| 1-152733 | 6/1989 | Japan . | |
| 0298746 | 12/1989 | Japan | 437/918 |
| 02303158 | 12/1990 | Japan . | |
| 0022561 | 1/1991 | Japan | 437/918 |
| 3-42831 | 2/1991 | Japan . | |
| 03089549 | 4/1991 | Japan . | |
| 0160752 | 7/1991 | Japan | 437/918 |
| 3-160752 | 7/1991 | Japan . | |
| 03214661 | 9/1991 | Japan . | |
| 4-152562 | 5/1992 | Japan | 257/538 |

OTHER PUBLICATIONS

"Annealing effect on the resistivity of polycrystalline silicon films passivated with plasma–deposited silicon–nitride films" by Yoji Saito et al., J. Appl. Phys., vol. 63, No. 4, Feb. 15, 1988, pp. 1117–1120.

"The hydrogen content of plasma–deposited silicon nitride" by W.A. Lanford, J. Appl. Phys., vol. 49, No. 4, Apr. 1978, pp 2473–2477.

*Primary Examiner*—Charles L. Bowers, Jr.
*Assistant Examiner*—Toniae M. Thomas
*Attorney, Agent, or Firm*—McDermott, Will & Emery

[57] ABSTRACT

A method of manufacturing a semiconductor device by forming first and second resistor layers of polycrystalline silicon including impurities on a first insulation film with a predetermined distance therebetween. The resistor layer have a resistance ratio set to a predetermined value. A second insulation film is formed on the first and second resistor layers and has an opening in a predetermined region. A metal layer electrically connected to the first and second resistor layers is formed in the opening and extends onto the second insulation film. The metal layer is patterned to form a first metal interconnection layer electrically connected to the first resistor layer and a second metal interconnection layer electrically connected to the second resistor layer. The first metal interconnection layer partially covers the first resistor layer. The second metal interconnection layer partially covers the second resistor layer. A plasma nitride film is formed on the first metal interconnection layer, second metal interconnection layer, first metal layer and second metal layer. The first and said second metal layers are patterned so that the overlapping area ratio between the first resistor layer and the first metal interconnection layer is substantially equal to the overlapping area ratio between the second resistor layer and the second metal layer.

20 Claims, 13 Drawing Sheets

AL0(ALUMINUM COVERED AREA RATIO=0%)

AL1 (ALUMINUM COVERED AREA RATIO=23%)

AL2(ALUMINUM COVERED AREA RATIO=45%)

AL3 (ALUMINUM COVERED AREA RATIO=78%)

CONSTANT VOLTAGE CIRCUIT $$V_{out} = \left(\frac{R_A}{R_B} - 1\right) V_{BE}$$

5,956,592

METHOD OF MANUFACTURING A SEMICONDUCTOR DEVICE HAVING POLYSILICON RESISTORS WITH A SPECIFIC RESISTANCE RATIO RESISTANT TO MANUFACTURING PROCESSES

This application is a division of application Ser. No. 08/316,380 filed Sep. 30, 1994 now U.S. Pat. No. 5,500,553, which is a continuation of Ser. No. 08/096,917, filed Jul. 26, 1993 now Abn.

BACKGROUND OF THE INVENTION

1. Field of the Invention

The present invention relates to a semiconductor device and a method of manufacturing thereof, and more particularly, to a semiconductor device having a resistor layer formed of polycrystalline silicon and a method of manufacturing thereof.

2. Description of the Background Art

A semiconductor device having a resistor element formed of polysilicon is conventionally known. FIG. 21 is a plan view of a semiconductor device having a conventional polysilicon resistor film. FIG. 22 is a sectional view of the semiconductor device of FIG. 21 taken along lines 22—22. Referring to FIGS. 21 and 22, a conventional semiconductor device includes a silicon substrate 1, an insulation oxide film 2 formed on the silicon substrate 1, polysilicon resistor films 3a and 3b formed with a predetermined distance therebetween and extending in substantially the same direction on the insulation oxide film 2, an insulation oxide film 4 formed on the polysilicon resistor films 3a, 3b and on the insulation oxide film 2, a metal interconnection layer 5a formed on the insulation oxide film 4 to cover the polysilicon resistor film 3a, a metal interconnection layer 7a electrically connected to the polysilicon resistor film 3a, and a metal interconnection layer 7b electrically connected to the polysilicon resistor film 3b, and a plasma nitride film 6 formed to cover metal interconnection layers 5a, 7a and 7b.

The polysilicon resistor films 3a and 3b are used for the purpose such as defining the output value of a circuit by the resistance ratio thereof. FIG. 23 is a circuit diagram showing a constant voltage circuit using polysilicon resistor films 3a and 3b. Referring to FIG. 23, the polysilicon resistor films 3a and 3b are employed as resistances $R_A$ and $R_B$, respectively. The output voltage $V_{OUT}$ is represented by the equation shown in FIG. 23 in which $Q_1$, $Q_2$ are transistors, $R_1$, $R_A$ and $R_B$ are resistances, $V_{CC}$ is power supply voltage, and $V_{BE}$ is the base-emitter voltage of a transistor Q1. The output voltage $V_{OUT}$ is determined by the resistance ratio of resistance $R_A$ (polysilicon resistor film 3a) to resistance $R_B$ (polysilicon resistor film 3b). The resistance ratio is controlled by changing the length or width of polysilicon resistor film 3a and polysilicon resistor film 3b, respectively.

As described above, there are cases where the output value of a circuit is determined by the resistance ratio of a polysilicon resistor film 3a to a polysilicon resistor film 3b.

However, a semiconductor device having conventional polysilicon resistor films as shown in FIGS. 21 and 22 had problems as set forth in the following. FIG. 24 is a sectional view of a structure of a semiconductor device having conventional polysilicon resistor films for describing the problems. Referring to FIG. 24, a great amount of hydrogen ions $H^+10$ is included in a plasma nitride film 6. More specifically, when plasma nitride film 6 is formed by a plasma CVD method, hydrogen components will be included in plasma nitride film 6. The details thereof is disclosed in J. Appl. Phys., Vol. 49, No. 4, April 1978 pp. 2473–2477. There was a disadvantage that these hydrogen ions $H^+10$ are provided to the grain boundary of the polysilicon resistor films 3a and 3b. This is disclosed in J. Appl. Phys., Vol 63, No. 4, 15 February 1988 pp. 1117–1120, for example. When the formed plasma nitride film 6 was subjected to a temperature of not less than 380° C. by a subsequent thermal process, there was a disadvantage of hydrogen ions $H^+10$ in plasma nitride film 6 being supplied to polysilicon resistor films 3a and 3b. It is needless to say that plasma nitride film 6 is indispensable in LSI as a passivation film for preventing intrusion of external ions.

If hydrogen ions 10 are applied to the polysilicon resistor films 3a and 3b from the plasma nitride film 6, the resistance values of polysilicon resistor films 3a and 3b will change. Because a metal interconnection layer 5a is formed above the polysilicon layer 3a, the amount of hydrogen ion 10 provided from the plasma nitride film 6 to the polysilicon resistor film 3a is less than that provided to the polysilicon resistor film 3b. A difference in the amount of hydrogen ion 10 provided will result in difference in the amount of change of the resistance values between the polysilicon resistor film 3a and the polysilicon resistor film 3b. Therefore, the resistance ratio of the polysilicon resistor film 3a and the polysilicon resistor film 3b will be changed. In such a case, the output voltage $V_{OUT}$ in a constant voltage circuit such as that shown in FIG. 23 will be changed according to the change in the resistance ratio of resistance $R_A$ (polysilicon resistor film 3a) to resistance $R_B$ (polysilicon resistor film 3b). There was a problem that an output value conforming to the design can not be obtained if there is a change in the resistance ratio of the polysilicon resistor film 3a to the polysilicon resistor film 3b.

The resistance used in an LSI linear circuit is implemented with a pair of a plurality of lines to have the output voltage and current determined by the resistance ratio thereof. Therefore, if the resistance ratio is changed, a desired output could not be obtained.

SUMMARY OF THE INVENTION

An object of the present invention is to effectively prevent the resistance ratio of a plurality of polysilicon resistor films from changing in a semiconductor device where a plasma nitride film is formed above the plurality of polysilicon resistor films.

Another object of the present invention is to control the resistance ratio of a plurality of polysilicon resistor films to a predetermined value in a semiconductor device where a plasma nitride film is formed above the plurality of polysilicon resistor films.

A further object of the present invention is to form without complicating the manufacturing process a metal covering layer for preventing change in the resistance ratio of a plurality of polysilicon resistor films in a method of manufacturing a semiconductor device having a plasma nitride film above the plurality of polysilicon resistor films.

According to an aspect of the present invention, a semiconductor device having a linear circuit controlling an output by adjusting the resistance ratio of a pair of first and second resistors includes a first resistor layer of polycrystalline silicon which becomes the first resistor, a second resistor layer of polycrystalline silicon which becomes the second resistor, a first metal layer formed to overlap the first resistor layer at a predetermined overlapping area ratio, a second metal layer formed to overlap the second resistor layer at an overlapping area ratio substantially equal to the predetermined overlapping area ratio, and a nitride film including hydrogen components formed to cover the first and second metal layers.

Because the overlapping area ratio between the first resistor layer and the first metal layer is substantially equal to that between the second resistor layer and the second metal layer, the changing rate of resistance of the first resistor layer is substantially equal to the changing rate of the resistor of the second resistor layer when hydrogen ions are provided from the nitride film including hydrogen components into the first and second resistor layers. Thus, the change in the resistance ratio of the first resistor layer to the second resistor layer can be prevented efficiently. As a result of controlling the resistance ratio of the first resistor layer to the second resistor layer, the change in the output value of a linear circuit controlling the output can effectively be prevented.

According to another aspect of the present invention, a semiconductor device includes a first resistor layer of polycrystalline silicon including impurities formed on a first insulation film, a second resistor layer of polycrystalline silicon including impurities formed apart from the first resistor layer by a predetermined distance and having the resistance ratio with the first resistor layer set to a predetermined value, a second insulation film formed on the first and second resistor layers, a first metal layer formed on the second insulation film to overlap partially the first resistor layer, a second metal layer formed on the second insulation film to overlap partially the second resistor layer, and a plasma nitride film formed on the first and second metal layers. The rate of the overlapping area of the first metal layer and the first resistor layer is substantially equal to the rate of the overlapping area of the second metal layer and the second resistor layer.

Because the rate of the overlapping area of the first metal layer and the first resistor layer is substantially equal to that of the second metal layer and the second resistor layer, the changing rate of the resistance of the first resistor layer is substantially equal to the changing rate of the resistance of the second resistor layer in the case hydrogen ions are provided from the plasma nitride film to the first and second resistor layers. Thus, the change in the resistance ratio between the first and second resistor layers can be prevented effectively.

According to a further aspect of the present invention, a semiconductor device includes a first resistor layer of polycrystalline silicon including impurities formed on a first insulation film, a second resistor layer of polycrystalline silicon including impurities formed apart from the first resistor layer by a predetermined distance and having the resistance ratio to the first resistor layer set to a predetermined value, a second insulation film formed in contact with the first and second resistor layers and the first insulation film, a metal interconnection layer formed on the second insulation film, and a nitride film including hydrogen components and formed in contact with the second insulation film and the metal interconnection layer, wherein the metal interconnection layer is formed so as not to overlap the first and second resistor layers.

There is no metal interconnection layer between the nitride film including hydrogen element and the first resistor layer or the second resistor layer that prevents the provision of hydrogen ions from the plasma nitride film, so that the provision rate of hydrogen ions to the first and second resistor layers are equal to each other. Thus, the changing rate of the resistance values of the first and second resistor layers become equal to prevent effectively a change in the resistance ratio of the first and second resistor layers.

According to still another aspect of the present invention, a method of manufacturing a semiconductor device includes the steps of forming first and second resistor layers of polycrystalline silicon including impurities formed on a first insulation film with a predetermined distance therebetween and having the resistance ratio thereof set to a predetermined value, forming a second insulation film having an opening in a predetermined region on the first and second resistor layers, forming a metal layer to provide electrical contact with the first and second resistor layers through the opening and extending along the second insulation film, forming a first metal interconnection layer electrically connected with the first resistor layer, a second metal interconnection layer electrically connected with the second resistor layer, a first metal layer partially overlapping the first resistor layer at a predetermined overlapping area ratio, and a second metal layer partially overlapping the second resistor layer at the same overlapping area ratio as the predetermined overlapping area ratio described above by patterning the metal layer, and forming a plasma nitride film on the first and second metal interconnection layers and the first and second metal covering layers, In operation, because a second insulation film having an opening in a predetermined region is formed on first and second resistor layers, a metal layer is formed providing electrical contact with the first and second resistor layers through the opening and extending along the second insulation film, first and second metal interconnection layers electrically connected to the first and second resistor layers, respectively, and first and second metal layers partially covering the first and second resistor layers at the same overlapping area ratio, respectively, are formed, the first and second metal covering layers are formed simultaneously at the time of forming the first and second metal interconnection layers, so that the manufacturing steps are not complicated.

According to a still further aspect of the present invention, the method of controlling the resistance ratio of the semiconductor device is characterized by controlling the resistance ratio of the first resistor layer to the second resistor layer by selecting the overlapping area ratio between the first resistor layer and the first metal layer and the second overlapping area ratio between the second resistor layer and the second metal layer to take a predetermined value to adjust the amount of hydrogen components from the nitride film to the first and second resistor layers.

By selecting the first overlapping area ratio between the first resistor layer and the first metal layer and the second overlapping area ratio between the second resistor layer and the second metal layer to take a predetermined value to adjust the amount of hydrogen components intruding into the first and second resistor layer from the nitride film, desired circuit characteristics can easily be obtained because the resistance ratio of the first resistor layer to the second resistor layer is controlled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First, an experiment was carried out as described below to observe how the resistance of a polysilicon resistor film changes according to the amount of hydrogen ions provided from a polysilicon resistor film. More specifically, the area of the metal polysilicon resistor layer covering a polysilicon resistor film is varied by four stages to measure the changing rate of resistance of the polysilicon resistor film. FIGS. 1–8 are sectional views and plan views of a semiconductor device having a polysilicon resistor film employed in the above experiments, and FIG. 9 is a correlation diagram showing the experiment results. In the present experiment, the aluminum covered area ratio of polysilicon resistor film 103 is varied by four stages of 0% (FIGS. 1 and 2), 23% (FIGS. 3 and 4), 45% (FIGS. 5 and 6), and 78% (FIGS. 7 and 8), and the changing rate of the resistance of polysilicon resistor film 103 was measured. The measured result is shown in FIG. 9.

Figure 1:
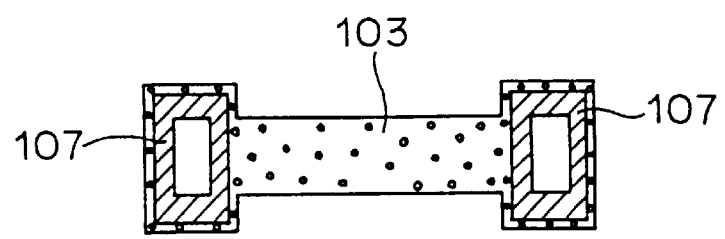
FIG. 1 is a plan view of an experiment sample AL0 (aluminum covered area ratio=0%) for measuring the relationship between the aluminum covered area ratio and the resistance increasing rate.
Figure 2:
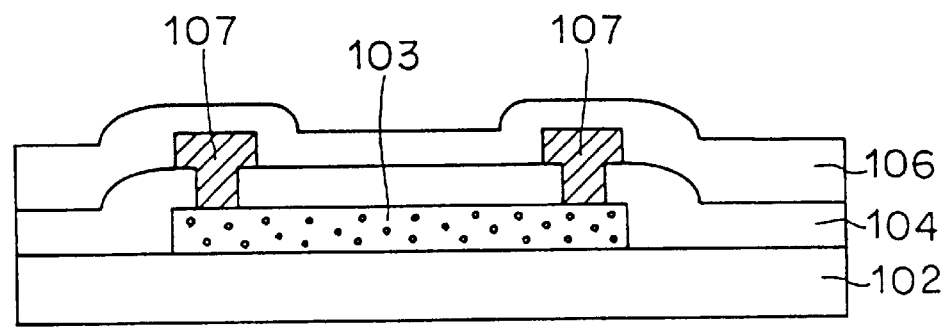
FIG. 2 is a sectional view of the experiment sample AL0 of FIG. 1.

Referring to FIGS. 1 and 2 where the aluminum covered area ratio is 0%, the structure of experiment sample AL0 includes an insulation oxide film 102 of $SiO_2$, a polysilicon resistor film 103 formed at a predetermined region on the insulation oxide film 102, an insulation oxide film 104 of CVD-$SiO_2$ formed to cover the polysilicon resistor film and having a contact hole in a predetermined region, an aluminum interconnection layer 107 electrically connected to the polysilicon resistor film 103 in the two contact holes of the insulation oxide film 104, and a plasma nitride film 106 formed to cover the aluminum interconnection layer 107 and insulation oxide film 104. Here, the aluminum covered area ratio is defined as the ratio of area of the aluminum layer executing the aluminum interconnection layer 107 with respect to the area of the polysilicon resistor film 103. In the experiment sample AL0 of FIGS. 1 and 2, the aluminum covered area ratio is 0% since there is no aluminum layer covering polysilicon resistor film 103.

Figure 3:
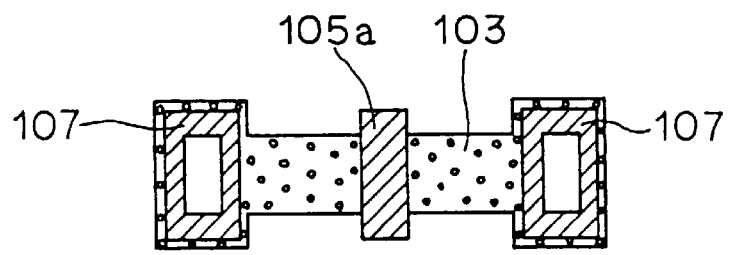
FIG. 3 is a plan view of an experiment sample AL1 (aluminum covered area ratio=23%) for measuring the relationship between the aluminum covered area ratio and the resistance increasing rate.
Figure 4:
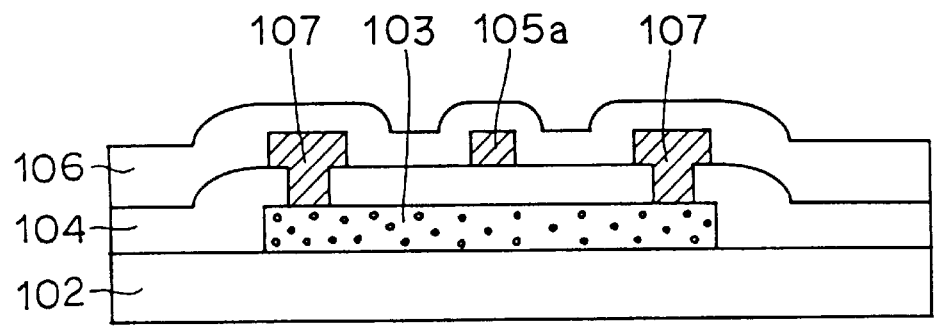
FIG. 4 is a sectional view of the experiment sample AL1 of FIG. 3.

In the experiment sample AL1 of FIGS. 3 and 4, an aluminum layer 105a is formed to cover the polysilicon resistor film 103. The covered area ratio of the aluminum layer 105a to the polysilicon resistor film 103 is 23%.

Figure 5:
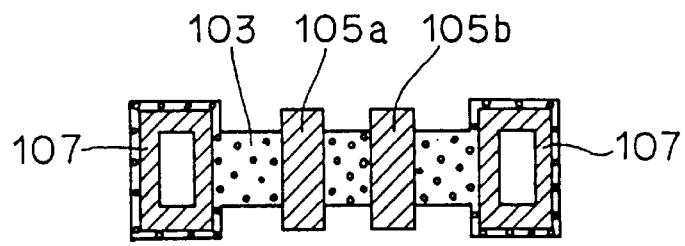
FIG. 5 is a plan view of an experiment sample AL2 (aluminum covered area ratio=45%) for measuring the relationship between the aluminum covered area ratio and the resistance increasing rate.
Figure 6:
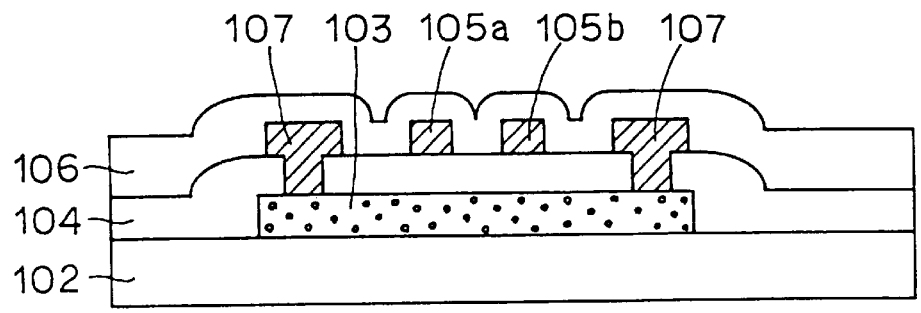
FIG. 6 is a sectional view of the experiment sample AL2 of FIG. 5.

Referring to FIGS. 5 and 6 of experiment sample AL2, aluminum layers 105a and 105b are formed to cover the polysilicon resistor film 103. The aluminum covered area ratio by aluminum layers 105a and 105b is 45%.

Figure 7:
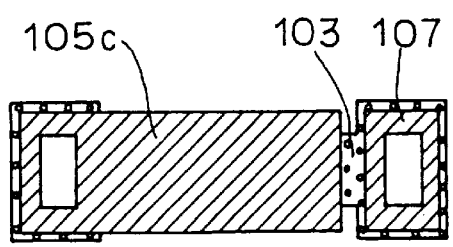
FIG. 7 is a plan view of an experiment sample AL3 (aluminum covered area ratio=78%) for measuring the relationship between the aluminum covered area ratio and the resistor increasing rate.
Figure 8:
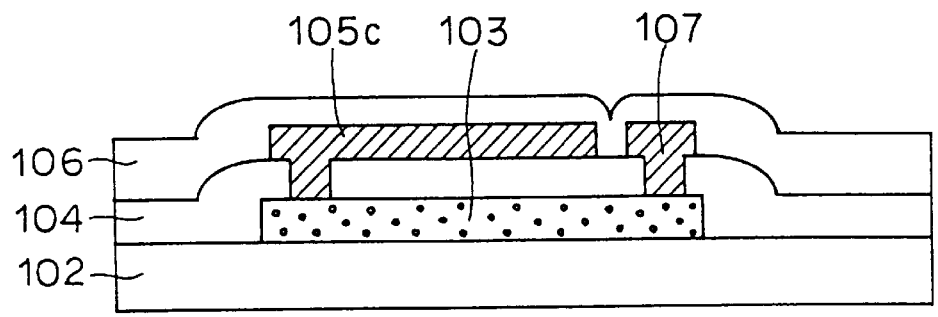
FIG. 8 is a sectional view of the experiment sample AL3 of FIG. 7.
Figure 9:
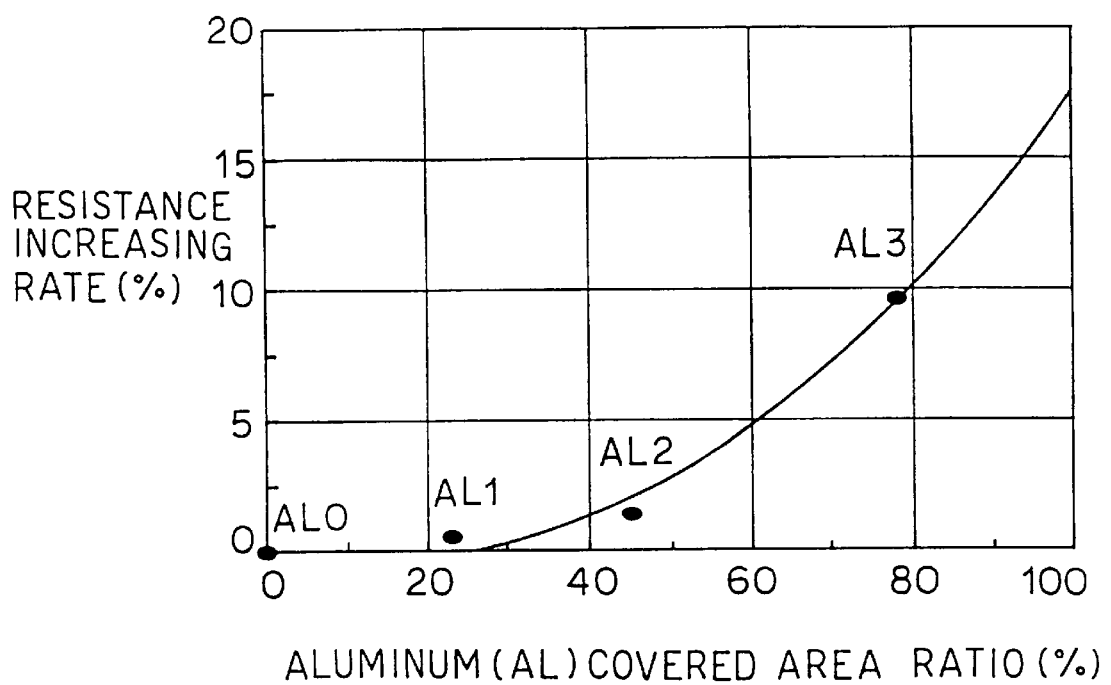
FIG. 9 is a correlation diagram showing the relationship between the aluminum covered area ratio and the resistor increasing rate based on the experiment samples of FIGS. 1–8.

Referring to FIGS. 7 and 8 of experiment samples AL3, an aluminum layer 105a is integrally formed with one of the aluminum interconnection layer. The aluminum covered area ratio by this aluminum layer 105c is 78%.

The resistance increasing rate of the polysilicon resistor film 103 was measured in the above four experiment samples of AL0–AL3 to obtain the result as shown in FIG. 9. It can be appreciated from FIG. 9 that the resistance is increased in proportion to the aluminum covered area ratio. This means that the resistance increases as the amount of hydrogen ions provided from the plasma nitride film 106 to the polysilicon resistor film 103 becomes lower. It was observed that the resistance can be controlled by adjusting the aluminum covered area ratio based on these experiment results. The embodiments of the present invention will be described hereinafter with reference to the drawings.

Figure 10:
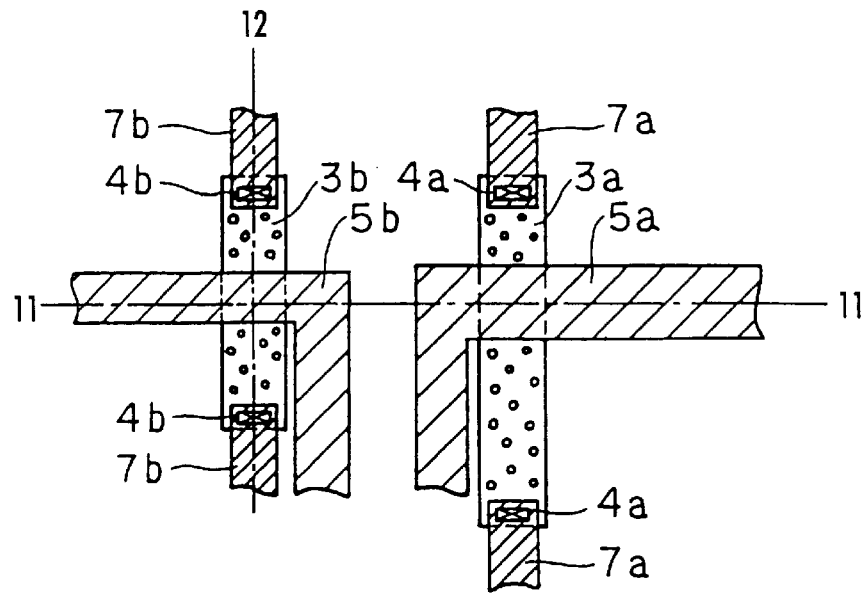
FIG. 10 is a plan view of a semiconductor device having a polysilicon resistor film according to a first embodiment of the present invention.
Figure 11:
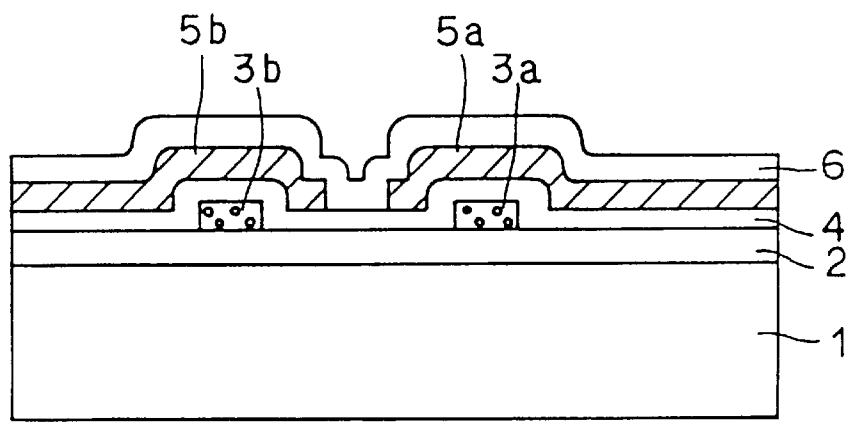
FIG. 11 is a sectional view of the semiconductor device of the first embodiment taken along line 11—11 of FIG. 10.
Figure 12:
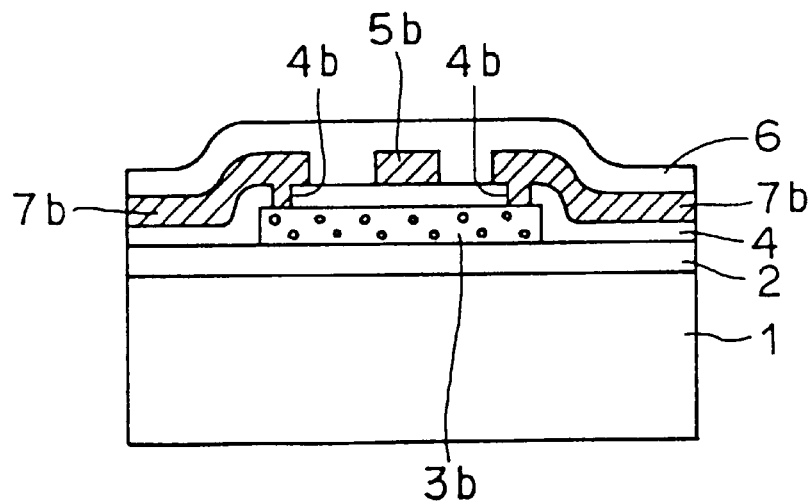
FIG. 12 is a sectional view of the semiconductor device of the first embodiment taken along 12—12 of FIG. 10.

Referring to FIGS. 10–12, the semiconductor device of the first embodiment includes a silicon substrate 1, an insulation oxide film 2 formed on the main surface of the silicon substrate 1, polysilicon resistor films 3a and 3b having a predetermined distance therebetween formed extending on the insulation oxide film 2, an insulation oxide film 4 formed on the polysilicon resistor films 3a, 3b and on the insulation oxide film 2, a metal interconnection layer 5a formed on the insulation oxide film 4 to cover the polysilicon resistor film 3a at a predetermined area ratio, a metal interconnection layer 5b formed on the insulation oxide film 4 to cover the polysilicon resistor film 3b at an area ratio identical to that of the metal interconnection layer 5a covering the polysilicon resistor film 3a, a metal interconnection layer 7b electrically connected to the polysilicon resistor film 3b via a contact hole 4b, a metal interconnection layer 7a electrically connected to the polysilicon resistor film 3a via a contact hole 4a and a plasma nitride film 6 formed to cover metal interconnection layers 5a, 5b, 7a and 7b.

The semiconductor device of the first embodiment is implemented to have metal interconnection layers 5a and 5b cover polysilicon resistor films 3a and 3b, respectively, wherein the rate of the overlapping area of the polysilicon resistor film 3a to the metal interconnection layer 5a is identical to that of the polysilicon resistor film 3b to the metal interconnection layer 5b. Such a structure causes the provision rate of hydrogen ions provided respectively to polysilicon resistor films 3a and 3b from the plasma nitride film 6 to be equal. As a result, the changing rate of the resistance value of the polysilicon resistor film 3a equals that of the resistance value of the polysilicon resistor film 3b, so that the change in the resistance ratio of the polysilicon resistor film 3a to the polysilicon resistor film 3b can be prevented effectively. Thus, even in the case where a plurality of polysilicon resistors are used with a plasma nitride film formed above the polysilicon resistor in a LSI linear circuit, the change in the resistance ratio of polysilicon resistor film 3a to the polysilicon resistor film 3b can be effectively prevented to obtain the circuit characteristics conforming to the design. A single layer film such as Al, AlSi, and AlSiCu, or a multilayer film of a combination of the aforementioned materials and TiN or TiW may be used for the metal interconnection layers 5a and 5b.

According to a manufacturing method of the present invention, an insulation oxide film 2 is formed on a silicon substrate 1. Then, polysilicon resistor films 3a and 3b having a predetermined distance therebetween are formed extending in a predetermined direction on the insulation oxide film 2. An insulation oxide film 4 is formed on the polysilicon resistor films 3a and 3b, and on the insulation oxide film 2. Contact holes 4a and 4b are formed on a predetermined region of the insulation oxide film 4 positioned on the polysilicon resistor films 3a and 3b, respectively. Metal interconnection layers 5a and 5b, and metal interconnection layers 7a and 7b are formed by patterning after the formation of a metal layer (not shown) all over the insulation oxide film 4 and within the contact holes 4a and 4b. Finally, a plasma nitride film 6 is formed as a protection film to cover the whole surface.

According to a manufacturing method of a semiconductor device of the first embodiment, the metal interconnection layers 5a and 5b are formed at the same time of the formation of metal interconnection layers 7a and 7b of the polysilicon resistor films 3a and 3b, respectively. Therefore, metal interconnection layers 5a and 5b can be formed easily that covers the polysilicon resistor films 3a and 3b respectively with the same rate of overlapping area without complicating the manufacturing process.

Figure 13:
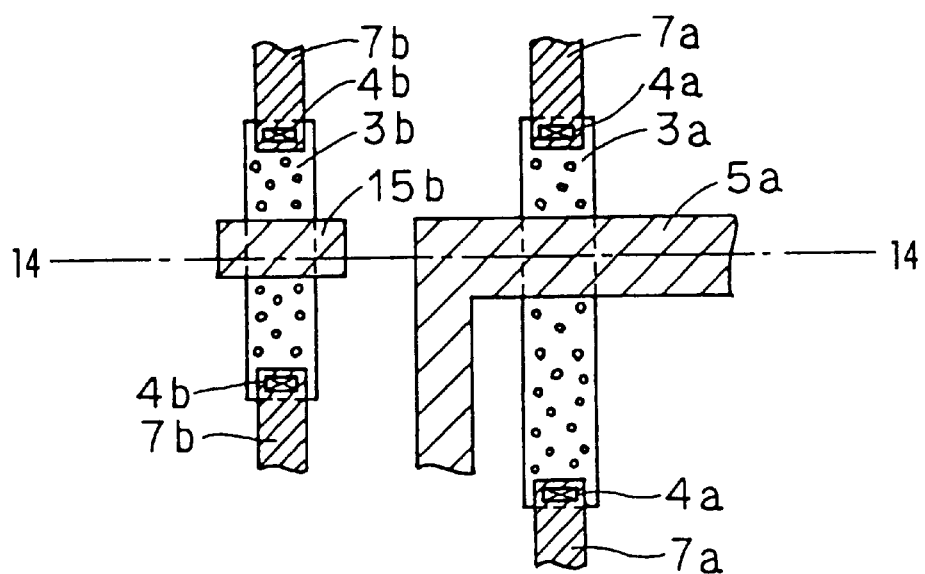
FIG. 13 is a plan view of a semiconductor device having a polysilicon resistor film according to a second embodiment of the present invention.
Figure 14:
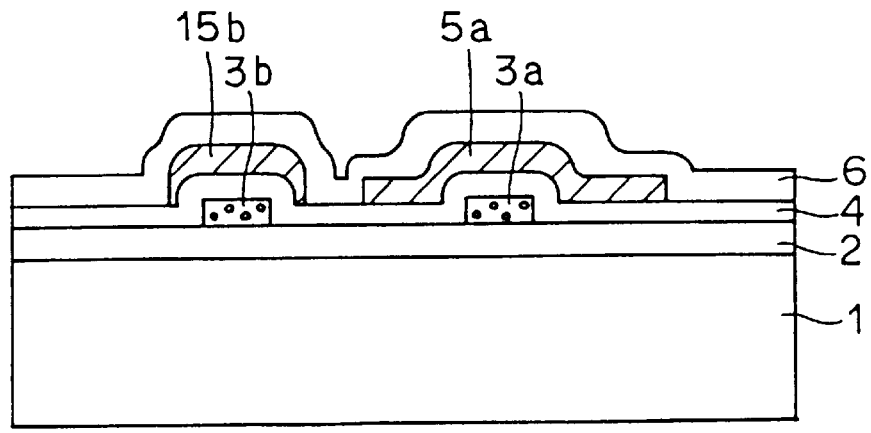
FIG. 14 is a sectional view of the semiconductor device of the second embodiment taken along line 14—14 of FIG. 13.

Referring to FIGS. 13 and 14, a semiconductor device of a second embodiment includes a silicon substrate 1, an insulation oxide film 2 formed on the main surface of the silicon substrate 1, polysilicon resistor films 3a and 3b with a predetermined distance therebetween extending in a predetermined direction on the insulation oxide film 2, an insulation oxide film 4 formed to cover polysilicon resistor films 3a and 3b and the insulation oxide film 2, a metal interconnection layer 5a formed on the insulation oxide film 4 to cover the polysilicon resistor film 3a by a predetermined overlapping area, a dummy metal interconnection layer 15b formed on the insulation oxide film 4 to cover the polysilicon resistor film 3b at a rate of an overlapping area equal that of the metal interconnection layer 5a covering the polysilicon resistor film 3a, a metal interconnection layer 7a electrically connected to the polysilicon resistor film 3a via a contact hole 4a, a metal interconnection layer 7b electrically connected to the polysilicon resistor film 3b via a contact hole 4b, and a plasma nitride film 6 formed to cover the metal interconnection layer 5a, the dummy metal interconnection layer 15b and the metal interconnection layers 7a and 7b.

As described above, the second embodiment is implemented so that the dummy metal interconnection layer 15b covers the polysilicon resistor film 3b by a rate of the overlapping area identical to that of the metal interconnection layer 5a covering the polysilicon resistor film 3a in the case where the metal interconnection layer 5a is provided above the polysilicon resistor film 3a. According to such a structure, an effect similar to that of the first embodiment can be obtained. That is to say, the provision rate of hydrogen ions provided from the plasma nitride film 6 to the respective polysilicon resistor films of 3a and 3b is identical, so that the changing rate of the resistance value of the polysilicon resistor film 3a is equal to that of the resistance value of the polysilicon resistor film 3b. Therefore, a change in the resistance ratio between the polysilicon resistor films 3a and 3b can be prevented effectively to obtain circuit characteristics conforming to the design value.

Because the dummy metal interconnection layer 15b can be formed at the same manufacturing step in which the metal interconnection layers 5a, 7a and 7b are formed, the manufacturing process will not be complicated.

Figure 15:
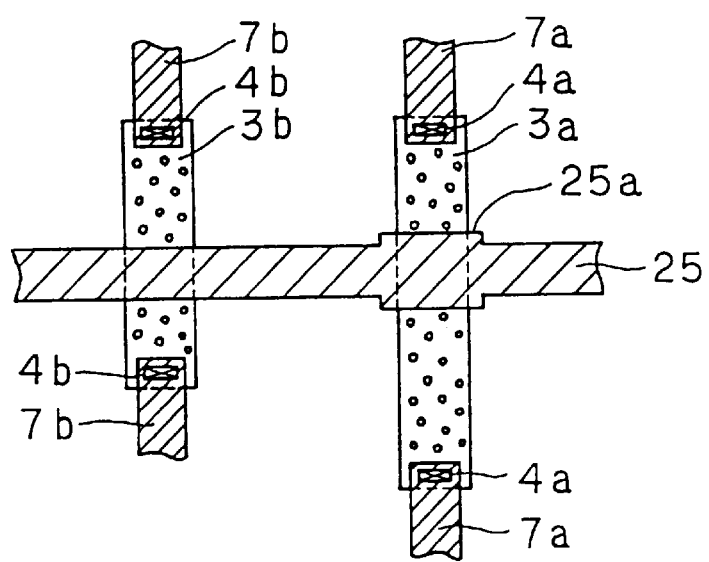
FIG. 15 is a plan view of a semiconductor device having a polysilicon resistor layer according to a third embodiment of the present invention.

FIG. 15 is a plan view of a semiconductor device having a polysilicon resistor film according to a third embodiment of the present invention. Referring to FIG. 15, the third embodiment is an application of the present invention where one interconnection layer 25 crosses both polysilicon resistor films 3a and 3b. When one interconnection layer 25 crosses polysilicon resistor films 3a and 3b, the line width of the metal interconnection layer 25 i.e of the region 25a located on the longer polysilicon resistor film 3a is made larger in comparison with other portions. This will set the covered area ratio of the metal interconnection layer 25 on polysilicon resistor films 3a and 3b to be substantially equal to each other. As a result, an effect similar to that of the first and second embodiments can be obtained in the third embodiment. More specifically, the provision rate of hydrogen ions from the plasma nitride film (not shown) to polysilicon resistor films 3a and 3b become equal, whereby the changing rate of resistance of a polysilicon resistor film 3a becomes equal to the changing rate of the resistance of the polysilicon resistor film 3b. Therefore, the change in the resistance ratio between the polysilicon resistor film 3a and the polysilicon resistor film 3b can effectively be prevented. Thus, circuit characteristics as designed can be obtained. The formation of the metal interconnection film 25 in the pattern configuration as shown in FIG. 15 can be carried out easily by conventional patterning technology, and will not complicate the manufacturing process.

Figure 16:
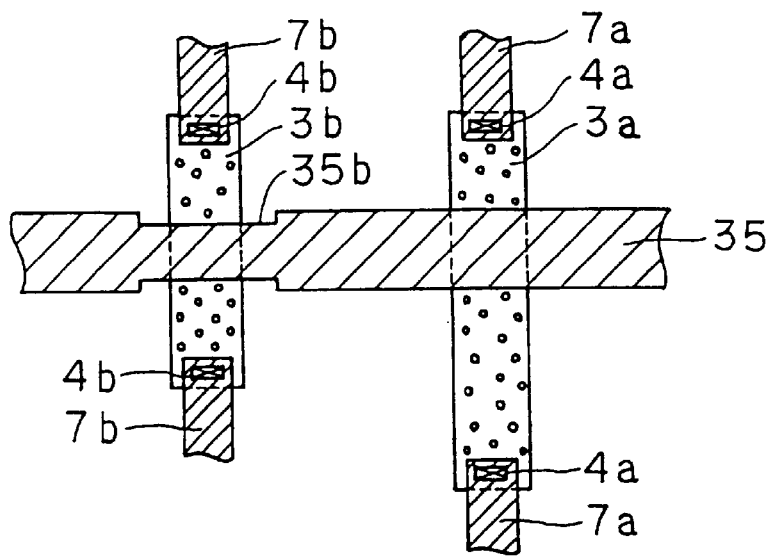
FIG. 16 is a plan view of a semiconductor device having a polysilicon resistor film according to a fourth embodiment of the present invention.

FIG. 16 is a plan view of a semiconductor device having a polysilicon resistor film according to a fourth embodiment of the present invention. Referring to FIG. 16, the fourth embodiment is an application of the present invention, similar to the above-described third embodiment, where one metal interconnection layer 35 is formed overlapping polysilicon resistor films 3a and 3b. More specifically, in the fourth embodiment, the line width of the metal interconnection layer 35, i.e of the region 35b located on the smaller polysilicon resistor film 3b is formed to be smaller than other regions. As a result, the covered area ratio of the metal interconnection layer 35 respectively with respect to polysilicon resistor films 3a and 3b can be made substantially equal. Therefore, an effect similar to the above-described first to third embodiments can be obtained. More specifically, the provision rate of hydrogen ions from the plasma nitride film (not shown) to polysilicon resistor films 3a and 3b become equal, whereby the changing rate of resistance of the polysilicon resistor film 3a is equal to the changing rate of the resistance of the polysilicon resistor film 3b. Therefore, the change in the resistance ratio of the polysilicon resistor film 3a to the polysilicon resistor film 3b can effectively be prevented. As a result, circuit characteristics as designed can be obtained.

Figure 17:
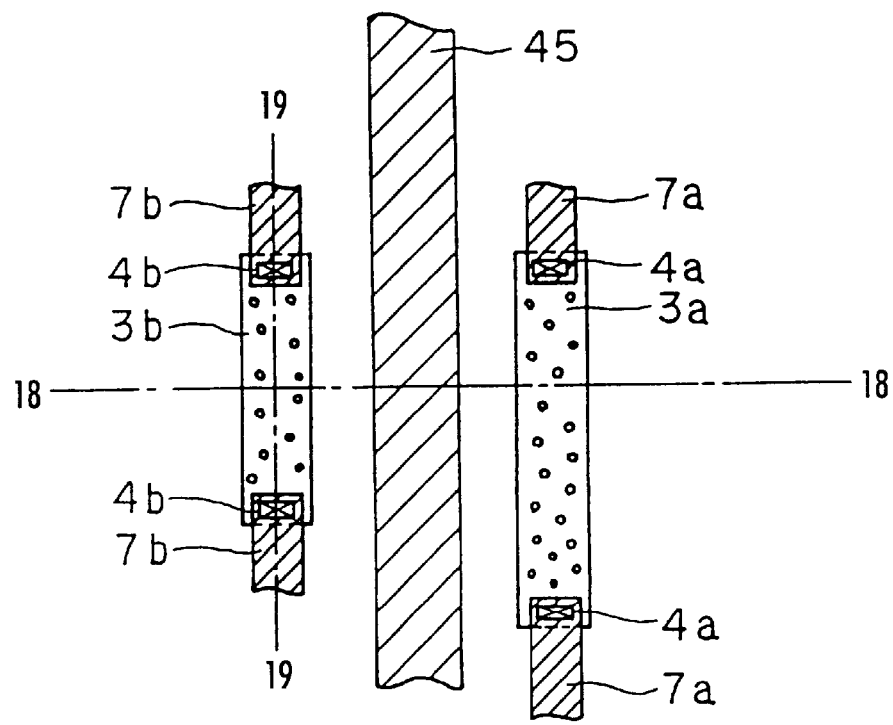
FIG. 17 is a plan view of a semiconductor device having a polysilicon resistor film according to a fifth embodiment of the present invention.
Figure 18:
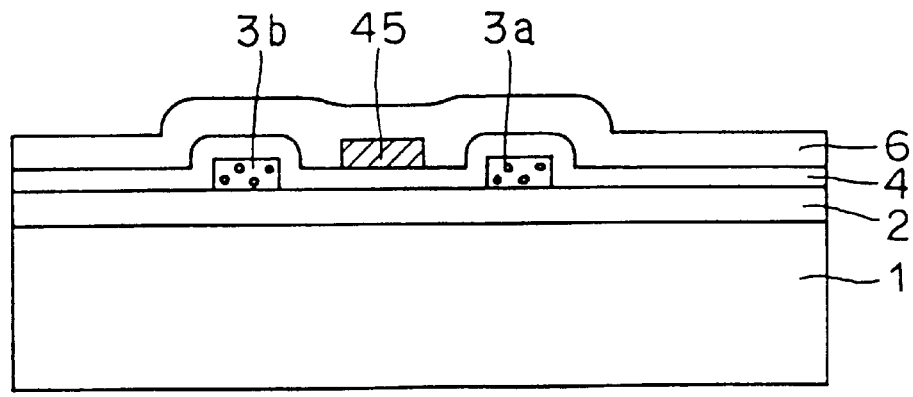
FIG. 18 is a sectional view of the semiconductor device according to the fifth embodiment taken along line 18—18 of FIG. 17.
Figure 19:
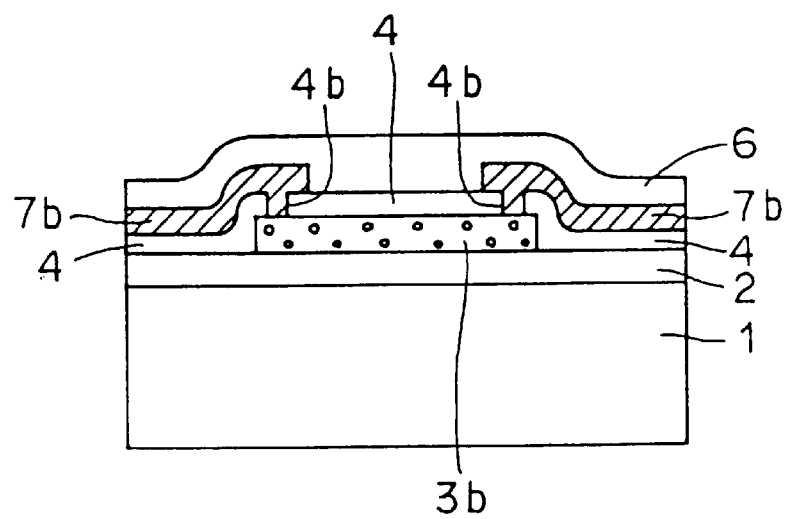
FIG. 19 is a sectional view of the semiconductor device of the fifth embodiment taken along line 19—19 of FIG. 17.

Referring to FIGS. 17–19, a semiconductor device of a fifth embodiment includes a silicon substrate 1, an insulation oxide film 2 formed on the main surface of the silicon substrate 1, polysilicon resistor films 3a and 3b having a predetermined distance therebetween and extending in a predetermined direction on the insulation oxide film 2, an insulation oxide film 4 formed in contact on polysilicon resistor films 3a and 3b and the insulation oxide film 2, a metal interconnection layer 7b electrically connected to the polysilicon resistor film 3b via a contact hole 4b provided in the insulation oxide film 4, a metal interconnection layer 7a electrically connected to the polysilicon resistor film 3a via a contact hole 4a, a metal interconnection layer 45 formed on the insulation oxide film 4 so as not to overlap the polysilicon resistor films 3a and 3b, and a plasma nitride film 6 formed as a protection film in contact on the metal interconnection layers 7a and 7b and the insulation oxide film 4.

The fifth embodiment is implemented so that there is no metal interconnection layer other than the metal interconnection layers 7a and 7b on the polysilicon resistor films 3a and 3b. According to such a structure, the provision rate of hydrogen ions provided from the plasma nitride film 6 respectively to the polysilicon resistor films 3a and 3b is equal, so that the changing rate of the respective resistance values of polysilicon resistor films 3a and 3b are equal to each other. Thus, the change in the resistance ratio between polysilicon resistor films 3a and 3b can be prevented effectively to obtain desired circuit characteristics.

Figure 20:
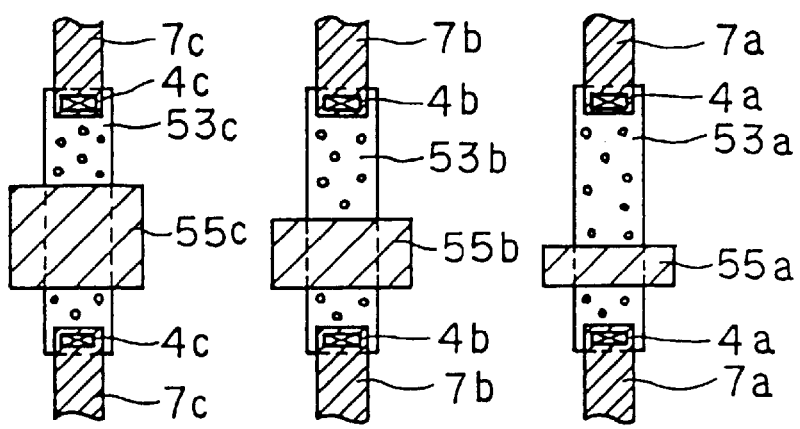
FIG. 20 is a plan view of a semiconductor device having a polysilicon resistor film according to a sixth embodiment of the present invention.
Figure 21:
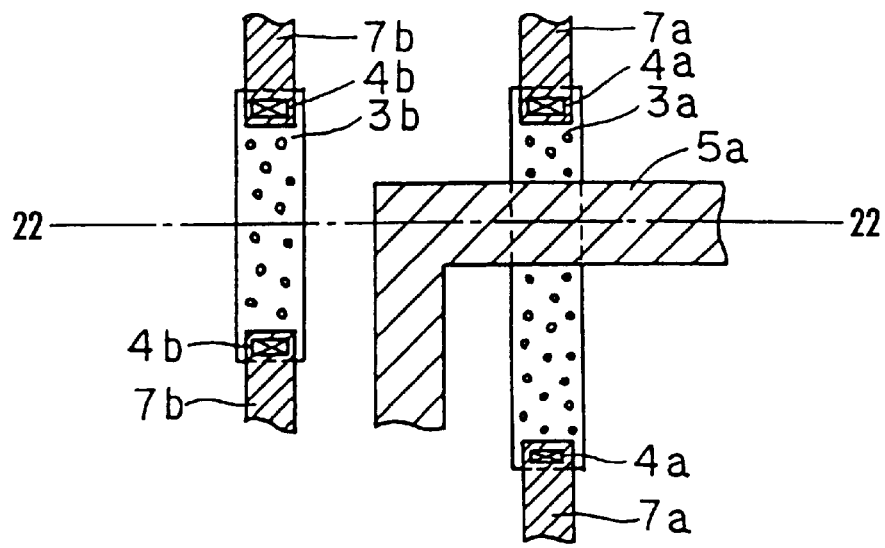
FIG. 21 is a plan view of a semiconductor device having a conventional polysilicon resistor film.
Figure 22:
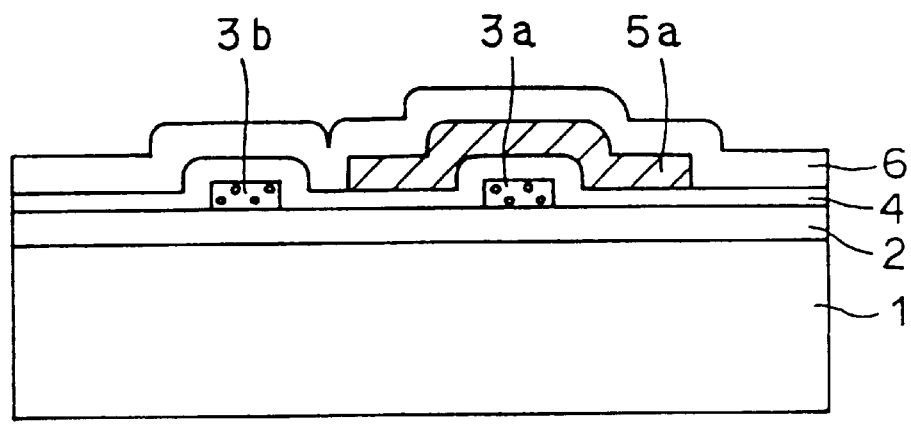
FIG. 22 is a sectional view of the conventional semiconductor device taken along line 22—22 of FIG. 21.
Figure 23:
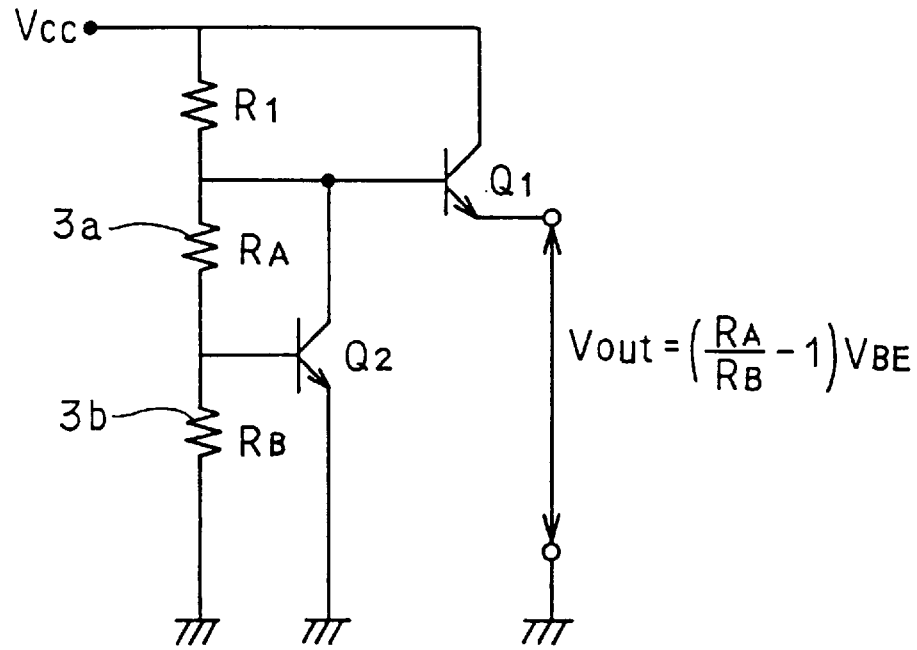
FIG. 23 is a circuit diagram showing a conventional constant voltage circuit.
Figure 24:
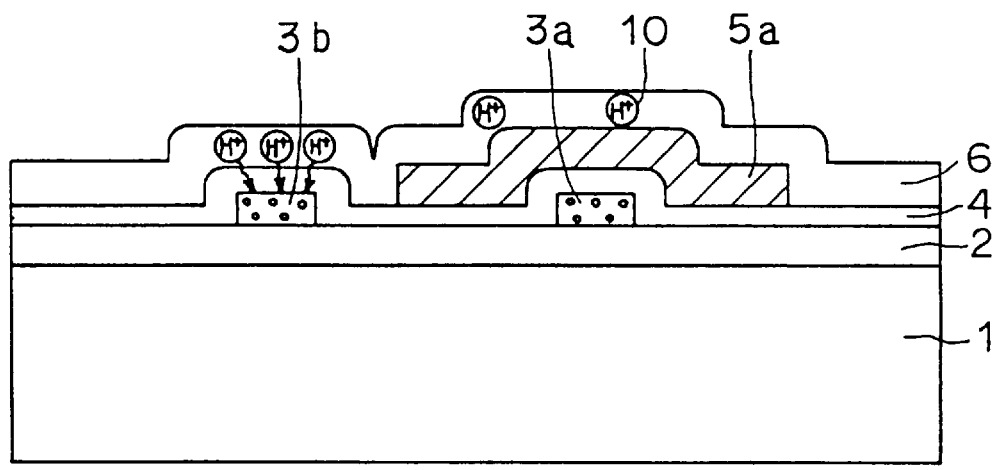
FIG. 24 is a sectional view of a semiconductor device having a conventional polysilicon resistor film for describing the problems thereof.

Referring to FIG. 20, a semiconductor device of a sixth embodiment includes three polysilicon resistor films 53a, 53b and 53c having the same pattern configuration with a predetermined distance therebetween. Metal interconnection layers 55a, 55b, and 55c formed to cover the polysilicon resistor films 53a, 53b, and 53c, respectively, have their pattern configuration changed. More specifically, the amount of hydrogen ions provided from the plasma nitride film (not shown) towards the polysilicon resistor films 53a, 53b and 53c of the same pattern configuration is varied by setting a different ratio of the overlapping area between the polysilicon resistor film 53a and the metal interconnection layer 55a, the polysilicon resistor film 53b and the metal interconnection layer 55b, and the polysilicon resistor film 53c and the metal interconnection layer 55c. Therefore, the resistance values of the polysilicon resistor films 53a, 53b and 53c can be set to an arbitrary value respectively. In the case shown in FIG. 20, the polysilicon resistor film 53c has the greatest resistance value, the polysilicon resistor film 53a has the smallest resistance value, and the polysilicon resistor film 53b has an intermediate resistance value. A desired resistance ratio can be obtained by selecting a predetermined covered area.

Thus, according to the present invention, a semiconductor device having a linear circuit controlling the resistance ratio of the first resistor layer to the second resistor layer has the provision rate of hydrogen ions from the plasma nitride film to first and second resistor layers set to an equal value by forming the first metal layer on the first resistor layer at the predetermined overlapping area ratio and forming the second metal layer on the second resistor layer at an overlapping area ratio substantially equal to the predetermined overlapping area ratio. Therefore, the changing rate of resistance of the first resistor layer and the changing rate of resistance of the second resistor layer become equal to effectively prevent change of the resistance ratio of the first resistor layer to the second resistor layer. Therefore, an output as designed can be obtained.

A semiconductor device according to the present invention has the first metal layer formed on a second insulation film to partially overlap a first resistor layer, and the second metal layer formed on the second insulation film to partially overlap a second resistor layer, wherein the ratio of the overlapping area of the first metal layer on the first resistor layer is substantially equal to that of the second metal layer on the second resistor layer, so that the provision rate of hydrogen ions provided from the plasma nitride film to the first and second resistor layers respectively is equal. Therefore, the changing rate of the resistance value of the first resistor layer equals that of the resistance value of the second resistor layer to prevent effectively a change in the resistance ratio between the first and second resistor layers. As a result, circuit characteristics in conformity with the design can be obtained.

A further semiconductor device according to the present invention has no metal interconnection layer other than the metal interconnection layer for the first and second resistor layers formed between the first and second resistor layers and the plasma nitride film. Therefore, the provision ratio of hydrogen ions provided from the plasma nitride film to the first and second resistor layers are equal, resulting in an equal changing rate of the resistance values of the first and second resistor layers. Thus, a change in the resistance ratio between the first and second resistor layers can be prevented effectively.

A method of manufacturing a semiconductor device according to the present invention includes. the steps of forming a second insulation film having an opening in a predetermined region on first and second resistor layers, forming a metal layer electrically in contact with the first and second resistor layers in the opening and extending on the second insulation film, and forming a first metal layer electrically in contact with the first resistor layer, a second metal layer electrically in contact with the second resistor layer, a first metal layer partially overlapping the first resistor layer at a predetermined overlapping area ratio, and the second metal layer partially overlapping the second resistor layer at the same overlapping area ratio as the predetermined overlapping area ratio described above, by patterning the metal layer, wherein the first and second metal covering layers are formed at the same time of the formation of the first and second metal interconnection layers. Therefore, a change in the resistance ratio between the first and second resistor layers can be easily prevented effectively without complicating the manufacturing step.

In the method of controlling the resistance ratio according to the present invention, the first overlapping area ratio between the first resistor layer and the first metal layer is selected to be substantially equal to the second overlapping area ratio between the second resistor layer and the second metal layer to adjust the amount of hydrogen components including into the first and second resistor layers. As a result, the resistance ratio of the first resistor layer to the second resistor layer is controlled, whereby a semiconductor circuit having predetermined resistance ratio can easily be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming first and second resistor layers of polycrystalline silicon including impurities on a first insulation film with a distance therebetween and having the resistance ratio set to a value, forming a second insulation film on said first and second resistor layers, and having an opening portion in a region, forming a metal layer electrically connected to said first and second resistor layers in said opening portion and extending on said second insulation film, patterning said metal layer to form a first metal interconnection layer electrically connected to said first resistor layer, a second metal interconnection layer electrically connected to said second resistor layer, the first metal interconnection layer partially covering said first resistor layer, and the second metal interconnection layer partially covering said second resistor layer, and forming a plasma nitride film on said first metal interconnection layer, said second metal interconnection layer, said first resistor layer and said second resistor layer, wherein said step of patterning said metal layer to form said first metal interconnection layer and said second metal interconnection layer includes patterning said metal layer so that the overlapping area ratio between said first resistor layer and said first metal interconnection layer is substantially equal to that of said second resistor layer and said second metal interconnection layer.

2. A method according to claim 1, wherein said plasma nitride film includes hydrogen components.

3. A method according to claim 1, wherein said polycrystalline silicon includes impurities.

4. A method according to claim 1, wherein said patterning of the metal layer adjusts the amount of hydrogen components intruding into the first and second resistor layers from the nitride film.

5. A method for controlling the resistance ratio of a first resistor layer of polycrystalline silicon and a second resistor layer of polycrystalline in forming a semiconductor device including the first resistor layer, the second resistor layer, a first metal layer formed to overlap said first resistor layer at a first overlapping area ratio, a second metal layer formed to overlap said second resistor layer at a second overlapping area ratio, and a nitride film including hydrogen components and formed to cover said first and second metal layers, comprising the steps of selecting said first overlapping area ratio between said first resistor layer and said first metal layer and said second overlapping area ratio between said second resistor layer and said second metal layer to take a value to adjust the amount of hydrogen components intruding into said first and second resistor layers from said nitride film.

6. A method according to claim 5, wherein said polycrystalline silicon includes impurities.

7. A method according to claim 5, wherein said second metal interconnection layer is a dummy layer.

8. A method according to claim 5, wherein:

said forming of the first and second resistor layers includes forming said first resistor layer with a first upper surface area and said second resistor layer with a second upper surface area different from said first upper surface area, and said selecting of said first overlapping area ratio includes selecting an area of said first metal layer to overlap said first resistor layer which is related to said first upper surface area, and said selecting of said second overlapping area ratio includes selecting an area of said second metal layer to overlap said second resistor layer which is related to said second upper surface area.

9. A method according to claim 8, wherein said area of the first metal layer and said area of the second metal layer are different.

10. A method according to claim 5, wherein said first and said second metal layers are formed of the same material.

11. A method according to claim 5, wherein said first overlapping area ratio and said second overlapping area ratio are selected to be substantially equal.

12. A method of manufacturing a semiconductor deice comprising the steps of:

forming first and second resistor layers of polycrystalline silicon including impurities on a first insulation film with a distance therebetween and having the resistance ratio set to a value, forming a second insulation film on said first and second resistor layers, and having an opening portion in a region, forming a metal layer electrically connected to said first and second resistor layers in said opening portion and extending on said second insulation film, patterning said metal layer to form a first metal interconnection layer electrically connected to said first resistor layer, a second metal interconnection layer electrically connected to said second resistor layer, the first metal interconnection layer partially covering said first resistor layer, and the second metal interconnection layer partially covering said second resistor layer, and forming a plasma nitride film on said first metal interconnection layer, said second metal interconnection layer, said first resistor layer and said second resistor layer, wherein said step of patterning said metal layer to form said first metal interconnection layer and said second metal interconnection layer includes patterning said metal layer so that the overlapping area ratio between said first resistor layer and said first metal interconnection layer is substantially equal to that of said second resistor layer and said second metal interconnection layer is a dummy layer.

13. A method of manufacturing a semiconductor deice comprising the steps of:

forming first and second resistor layers of polycrystalline silicon including impurities on a first insulation film with a distance therebetween and having the resistance ratio set to a value, forming a second insulation film on said first and second resistor layers, and having an opening portion in a region, forming a metal layer electrically connected to said first and second resistor layers in said opening portion and extending on said second insulation film, patterning said metal layer to form a first metal interconnection layer electrically connected to said first resistor layer, a second metal interconnection layer electrically connected to said second resistor layer, the first metal interconnection layer partially covering said first resistor layer, and the second metal interconnection layer partially covering said second resistor layer, and forming a plasma nitride film on said first metal interconnection layer, said second metal interconnection layer, said first resistor layer and said second resistor layer, wherein said step of patterning said metal layer to form said first metal interconnection layer and said second metal interconnection layer includes patterning said metal layer so that the overlapping area ratio between said first resistor layer and said first metal interconnection layer is substantially equal to that of said second resistor layer and said second metal interconnection layer, said forming of the first and second resistor layers includes forming said first resistor layer with a first upper surface area and said second resistor layer with a second upper surface area different from said first upper surface area, and said patterning of said metal layer includes forming an area of said first metal interconnection layer which overlaps said first resistor layer and is related to said first upper surface area and an area of said second metal interconnection layer which overlaps said second resistor layer and is related to said second upper surface area.

14. A method according to claim 13, wherein said area of said first metal interconnection layer and said area of said second metal interconnection layer are different.

15. A method of manufacturing semiconductor device, comprising the steps of:

forming a first resistor layer, forming a second resistor layer separated from said first resistor layer by a distance, a resistance ratio of said second resistor layer with respect to said first resistor layer being set to a value, forming a first metal layer to partially overlap said first resistor layer and having an area overlapping said first resistor layer, forming a second metal layer to partially overlap said second resistor layer and having an area overlapping said second resistor layer which is different than the area of the first metal layer overlapping said first resistor layer, and wherein the rate of the overlapping area of said first metal layer on said first resistor layer is substantially equal to the rate of the overlapping area of the second metal layer on said second resistor layer.

16. A method according to claim 15, wherein said first resistor layer and said second resistor layer are formed of the same material, and said first metal layer and said second metal layer are formed of the same material.

17. A method according to claim 15, wherein said first and said second resistor layers are formed of polycrystalline silicon including impurities.

18. A method according to claim 15, further comprising the step of forming an insulation film and wherein said first and said second resistor layers are formed on said insulating film.

19. A method according to claim 15, further comprising the step of forming an insulation film on said first and second resistor layers and said first and second metal layers are formed on said insulating film.

20. A method according to claim 15, further comprising forming a nitride film including hydrogen element on said first and second metal layers.

* * * * *